United States Patent
Kim et al.

(10) Patent No.: US 7,293,907 B2
(45) Date of Patent: Nov. 13, 2007

(54) BACKLIGHT FOR DISPLAY DEVICE, LIGHT SOURCE FOR DISPLAY DEVICE, AND LIGHT EMITTING DIODE USED THEREFOR

(75) Inventors: Gi-Cherl Kim, Yongin-si (KR); Chun-Ho Song, Seoul (KR); Ju-Young Yoon, Suwon-si (KR); Sang-Gil Lee, Seoul (KR); Seock-Hwan Kang, Suwon-si (KR); Jin-Ha Kim, Seoul (KR); Jong-Seo Lee, Hwaseong-si (KR); Sang-Yu Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 124 days.

(21) Appl. No.: 11/169,528

(22) Filed: Jun. 29, 2005

(65) Prior Publication Data

US 2005/0286264 A1 Dec. 29, 2005

(30) Foreign Application Priority Data

Jun. 29, 2004 (KR) ...................... 10-2004-0049454

(51) Int. Cl.
F21V 7/04 (2006.01)
(52) U.S. Cl. ..................................... 362/612
(58) Field of Classification Search ................ 362/612, 362/84, 231, 249, 255
See application file for complete search history.

(56) References Cited

U.S. PATENT DOCUMENTS 6,508,564 B1 1/2003 Kuwabara et al.
2002/0006040 A1* 1/2002 Kamada et al. ............. 362/237
2002/0175632 A1* 11/2002 Takeguchi ................ 315/169.1
2004/0021629 A1* 2/2004 Sasuga et al. .............. 345/102
2004/0027041 A1* 2/2004 Nishikawa .................. 313/110

FOREIGN PATENT DOCUMENTS

| JP | 2000-275636 | 10/2000 |
|---|---|---|
| JP | 2002075038 | 3/2002 |
| JP | 2002231032 | 8/2002 |
| JP | 2002270020 | 9/2002 |
| JP | 2002350846 | 12/2002 |
| KR | 1020020041479 | 6/2002 |
| KR | 1020020047534 | 6/2002 |
| KR | 1020020062572 | 7/2002 |
| KR | 1020040026892 | 4/2004 |
| KR | 1020040026893 | 4/2004 |
| KR | 1020040029230 | 4/2004 |
| KR | 1020040029232 | 4/2004 |
| WO | WO 01/41215 A1 | 6/2001 |

OTHER PUBLICATIONS

European Search Report for Application No. 05253892.3-2205. Mailed Dec. 7, 2005.
JP2000-275636. Publication Date: Oct. 6, 2000. "Light Source and Illumination Device as Well as Liquid Crystal Device Using the Illumination Device". (Abstract Only).

* cited by examiner

*Primary Examiner*—Ross Gushi
(74) *Attorney, Agent, or Firm*—Cantor Colburn LLP

(57) ABSTRACT

A light source for a display device includes a board and light emitting diodes mounted on the board. The light emitting diodes include a white light emitting diode which emits white light and a red light emitting diode which emits red light.

25 Claims, 13 Drawing Sheets

BACKLIGHT FOR DISPLAY DEVICE, LIGHT SOURCE FOR DISPLAY DEVICE, AND LIGHT EMITTING DIODE USED THEREFOR

This application claims priority to Korean Patent Application No. 10-2004-0049454, filed on Jun. 29, 2004, the contents of which in its entirety are herein incorporated by reference.

BACKGROUND OF THE INVENTION (a) Field of the Invention

The present invention relates to a light source for a display device.

(b) Description of the Related Art

Image display devices, such as a television receiver or a computer monitor, are classified as either a self-luminescence display device capable of self-emitting light or a light receiving display device requiring a separate light source. Organic light emitting displays (OLEDs), vacuum fluorescent displays (VFDs), field emission displays (FEDs), plasma display panels (PDPs), etc. are examples of self-luminescence display devices, while liquid crystal display (LCD) devices, are an example of the light receiving display device.

Generally, LCD devices include a pair of panels having field generating electrodes disposed at an inner surface, and a liquid crystal layer interposed between the pair of panels having dielectric anisotropy. In an LCD device, a variation of a voltage difference between the field generating electrodes, i.e., a variation in a strength of an electric field generated by the field generating electrodes, changes a transmittance of light passing through the LCD device. Thus desired images are obtained by controlling the voltage difference between the field generating electrodes.

In the LCD devices, light may be provided by a natural light source or an artificial light source separately employed in an LCD device.

A backlight device is a representative artificial light source for the LCD devices. The backlight device utilizes light emitting diodes (LEDs) or fluorescent lamps such as cold cathode fluorescent lamps (CCFLs) and external electrode fluorescent lamps (EEFLs), etc. as the light source.

LEDs have eco-friendly characteristics since the LEDs do not use mercury (Hg) and a working lifetime of an LED is longer than a working lifetime of most other light sources due to stable characteristics of the LED. For these reasons, the LED is a popular choice as a next-generation light source.

SUMMARY OF THE INVENTION

An objective of the present invention is to provide a light source for a display device having prominent color reproducibility. Another objective of the present invention is to provide a light source for a display device enabling thin and compact display production.

To achieve the objectives, in the light source according to a feature of the present invention, a mixed-color-emitting LED having two or more color components in the primary colors is arranged along with a single-color-emitting LED.

In more detail, according to one aspect of the present invention, there is provided a light source for a display device including a board and light emitting diodes (LEDs) mounted on the board. The LEDs includes a white LED which emits white light and a red LED which emits red light.

According to another aspect of the present invention, there is provided a light source for a display device including a board, a first LED mounted on the board, and a second LED mounted on the board. The first LED includes an LED chip and a fluorescent material for converting a wavelength of light emitted from the LED chip. The second LED includes no fluorescent material.

According to still another aspect of the present invention, there is provided a light source for a display device including a board, a first LED mounted on the board, and a second LED mounted on the board. The first LED emits light having a spectrum width which spans a wavelength range below about 600 nm. The second LED emits light having a spectrum width which spans a wavelength range above about 600 nm.

According to still another aspect of the present invention, there is provided a light emitting diode (LED) including a lead frame, a first LED chip mounted on the lead frame, a fluorescent material which covers the first LED chip, a second LED chip mounted on the lead frame, and a molding element which covers all of the first LED chip, the fluorescent material and the second LED chip.

According to still another aspect of the present invention, there is provided a backlight device including a light guiding plate, and a first light source disposed at a first edge of the light guiding plate and including a white LED emitting white light and a red LED emitting a red light mainly having one component of red, green, and blue components.

According to still another aspect of the present invention, there is provided a backlight device including a board, a white LED mounted on the board emitting a white light, a red LED mounted on the board and emitting a red light, and a reflecting plate mounted on the board and including holes for exposing portions of the white LED and the red LED.

According to still another aspect of the present invention, there is provided a light source for a display device including a board, a first LED mounted on the board, and a second LED mounted on the board. The first LED emits light having a spectrum width which spans a first wavelength range. The second LED emits light having a spectrum width which spans a second wavelength range. The first and second wavelength ranges are substantially mutually exclusive and the first and second wavelength ranges combine to substantially span an entire wavelength range of visible light.

BRIEF DESCRIPTION OF THE DRAWINGS

The above and other objects and advantages of the present invention will become more apparent by describing the exemplary embodiments thereof in more detail with reference to the accompanying drawings.

DETAILED DESCRIPTION OF THE INVENTION

Figure 1:
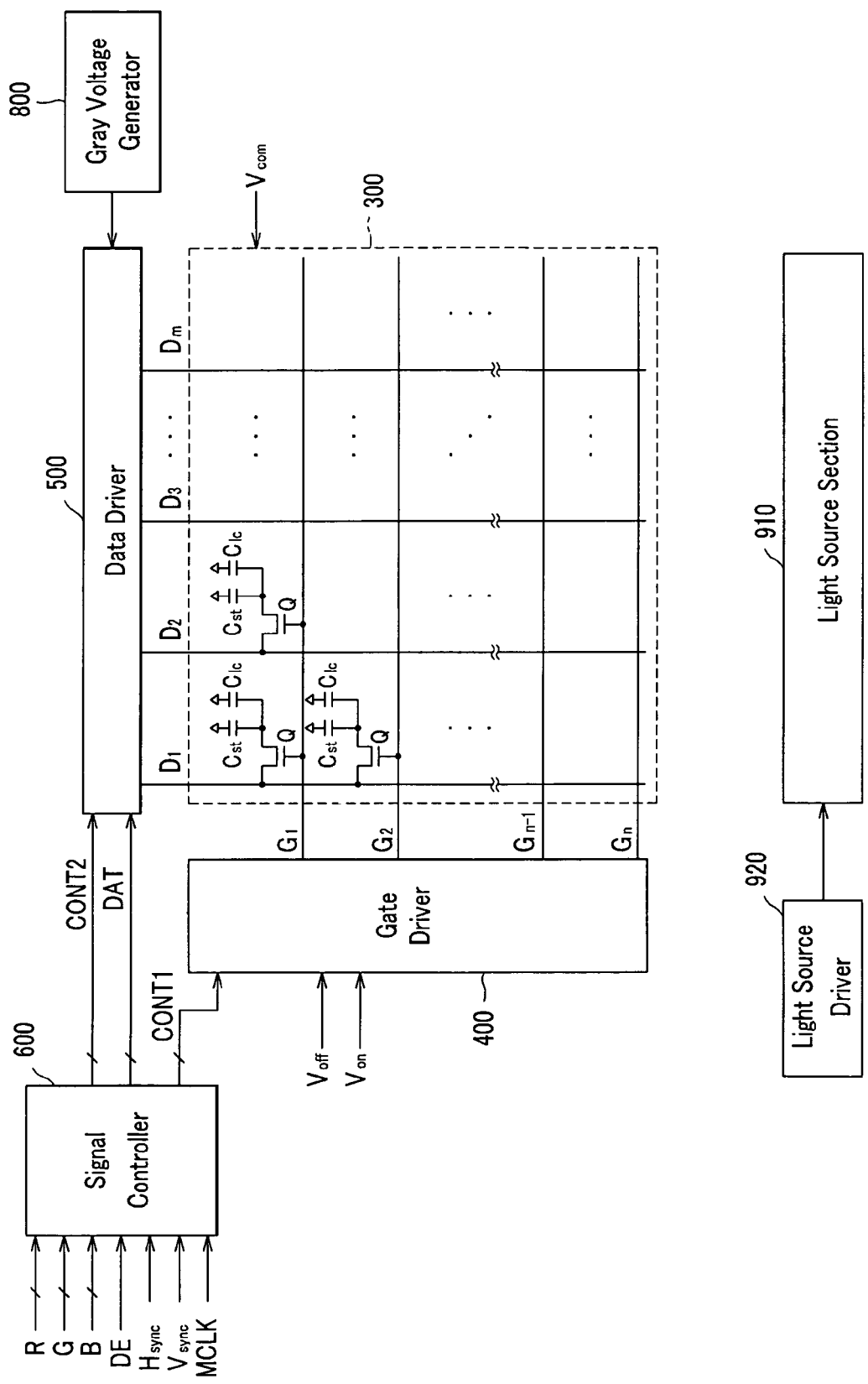
FIG. 1 is a block diagram of an LCD device according to an exemplary embodiment of the present invention.

Embodiments of the present invention will now be described more fully hereinafter with reference to the accompanying drawings, in which exemplary embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of the layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Hereinafter, a driving system of a light source device for a display device according to exemplary embodiments of the present invention will be described in detail with reference to the accompanying drawings.

Figure 2:
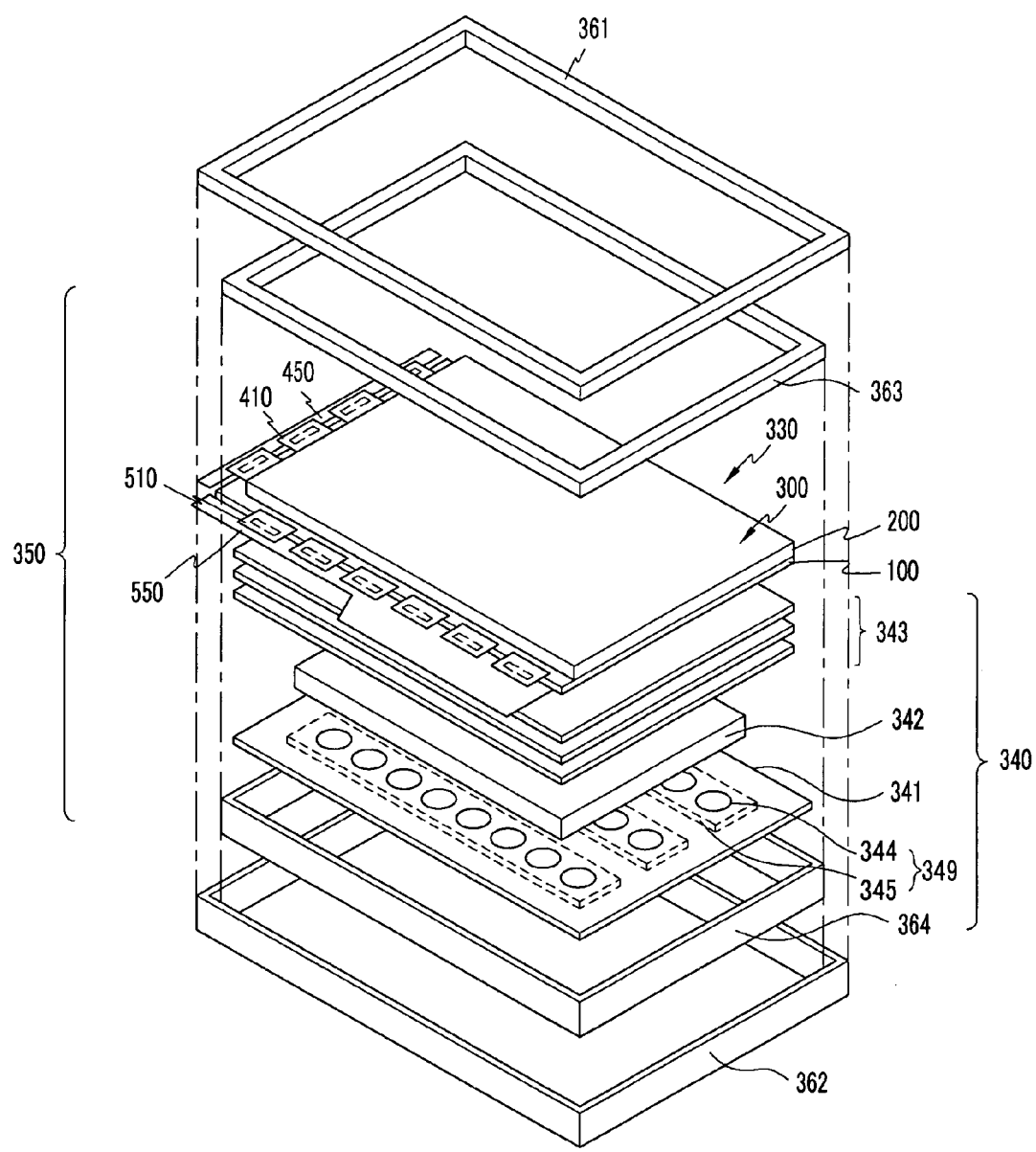
FIG. 2 is an exploded perspective view schematically illustrating an LCD device according to an exemplary embodiment of the present invention.
Figure 3:
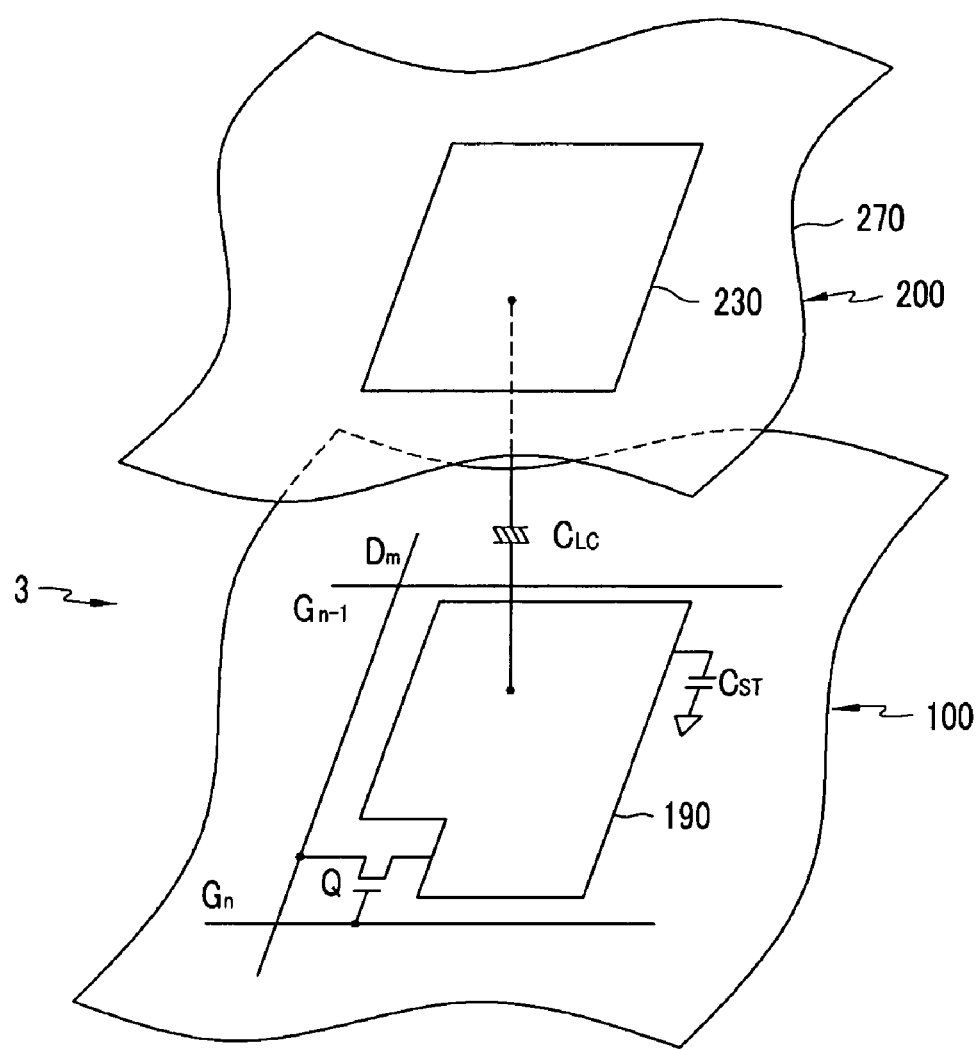
FIG. 3 is an equivalent circuit view of a pixel unit of an LCD device according to an exemplary embodiment of the present invention.

FIG. 1 is a block diagram of an LCD device according to an exemplary embodiment of the present invention. FIG. 2 is an exploded perspective view schematically illustrating an LCD device according to an exemplary embodiment of the present invention. FIG. 3 is an equivalent circuit view of a pixel unit of an LCD device according to an exemplary embodiment of the present invention.

Referring to FIG. 1, an LCD device according to an exemplary embodiment of the present invention comprises an LC panel assembly 300, a gate driver 400 and a data driver 500 which are electrically connected to the LC panel assembly 300, a gray voltage generator 800 electrically connected to the data driver 400, a light source section 910 for supplying the light to the LC panel assembly 300, a light source driver 920 for controlling the light source section 910, and a signal controller 600 for controlling the above elements.

Referring to FIG. 2, the LCD device according to an exemplary embodiment of the present invention comprises an LC module 350 including a display unit 330 and a backlight 340, a front housing 361 and a rear housing 362 for receiving and supporting the LC module 350, and a first mold frame 363 and a second mold frame 364.

The display unit 330 includes the LC panel assembly 300, a gate tape carrier package (TCP) 410 and a data TCP 510 which are attached to the LC panel assembly 300, and a gate printed circuit board (PCB) 450 and a data PCB 550 which are individually attached to the gate and data TCPs 410 and 510, respectively.

In the structure shown in FIGS. 2 and 3, the LC panel assembly 300 includes a lower panel 100 and an upper panel 200 facing each other, and an LC layer 3 disposed between the lower and upper panels 100 and 200. In an equivalent circuit shown in FIGS. 1 and 3, the LC panel assembly 300 includes display signal lines $G_1$-$G_n$ and $D_1$-$D_m$ and pixels connected to the display signal lines $G_1$-$G_n$ and $D_1$-$D_m$ and arranged substantially in a matrix.

The display signal lines $G_1$-$G_n$ and $D_1$-$D_m$ are provided on the lower panel 100 and include gate lines $G_1$-$G_n$ for transmitting gate signals (also referred to as "scanning signals"), and data lines $D_1$-$D_m$ for transmitting data signals or data voltages. The gate lines $G_1$-$G_n$ extend substantially in a row direction of the LC panel assembly 300 and are substantially parallel to each other, while the data lines $D_1$-$D_m$ extend substantially in a column direction of the LC panel assembly 300 and are substantially parallel to each other.

Each pixel includes a switching element Q, which is electrically connected to selected ones of the display signal lines $G_1$-$G_n$ and $D_1$-$D_m$, and an LC capacitor $C_{LC}$ and a storage capacitor $C_{ST}$ each of which is electrically connected to the switching element Q. The storage capacitor $C_{ST}$ may be omitted.

The switching element Q, such as a thin film transistor (TFT), is provided on the lower panel 100 and has three terminals: a control terminal connected to one of the gate lines $G_1$-$G_n$; an input terminal connected to one of the data lines $D_1$-$D_m$; and an output terminal connected to both the LC capacitor $C_{LC}$ and the storage capacitor $C_{ST}$.

The LC capacitor $C_{LC}$ includes a pixel electrode 190 provided on the lower panel 100 and a common electrode 270 provided on the upper panel 200 as two terminals. The LC layer 3 interposed between the pixel and common electrodes 190 and 270 functions as a dielectric of the LC capacitor $C_{LC}$. The pixel electrode 190 is electrically connected to the switching element Q, and the common electrode 270 is supplied with a common voltage $V_{com}$ and covers an entire surface of the upper panel 200. As an alternative to the embodiment shown in FIG. 3, the common electrode 270 may be provided on the lower panel 100. In such a case, at least one of the pixel electrode 190 and the common electrode 270 may be shaped as a bar or a stripe.

The storage capacitor $C_{ST}$ is an auxiliary capacitor for the LC capacitor $C_{LC}$. When the pixel electrode 190 and a separate signal line (not shown) which is provided on the lower panel 100 are overlapped with each other, having an insulator therebetween, an overlap portion between the pixel electrode 190 and the separate signal line forms the storage capacitor $C_{ST}$. The separate signal line is supplied with a predetermined voltage such as, for example, the common voltage $V_{com}$. Alternatively, the storage capacitor $C_{ST}$ may be formed by an overlapping of the pixel electrode 190 and a previous gate line, which is placed directly before the pixel electrode 190, having an insulator therebetween.

For a color display, each pixel uniquely exhibits one of three primary colors (i.e., spatial division), or sequentially exhibits three primary colors in turn depending on time (i.e., temporal division), so that a spatial or temporal sum of the primary colors are recognized as a desired color. FIG. 3 shows an example of the spatial division, in which each pixel includes a color filter 230 for exhibiting one of the primary colors in an area of the upper panel 200 corresponding to the pixel electrode 190. As an alternative to the embodiment shown in FIG. 3, the color filter 230 may be provided on or under the pixel electrode 190.

Referring to FIG. 2, the backlight 340 is mounted under the LC panel assembly 300. The backlight 340 comprises a light source unit 349 including light emitting diodes (LEDs) 344 arranged on a printed circuit board (PCB) 345, a light guiding plate 342 and optical sheets 343 which are provided between the LC panel assembly 300 and the LEDs 344 for dispersing light emitted from the LEDs 344 to the LC panel assembly 300. The backlight 340 further comprises a reflecting plate 341, which is disposed over the PCB 345 and includes holes corresponding to each of the LEDs 344. The LEDs 344 are protruded through each corresponding hole, thereby allowing the reflecting plate 341 to reflect light emitted from the LEDs 344 toward the LC panel assembly 300. The backlight 340 further comprises the first and second mold frames 363 and 364, which are provided to maintain regular intervals between the light source unit 349 and the light guiding plate 3.42 and for supporting the light guiding plate 342 and the optical sheets 343.

The LEDs 344 provide light to the LC panel assembly 300 and include white LEDs emitting white light and red LEDs emitting red light. The white and red LEDs are arranged on the PCB 345 in a predetermined arrangement, thereby forming the light source unit 349.

Although FIG. 2 shows three light source units 349, it should be understood that a number of the light source units 349 may be varied in accordance with specific operational requirements.

FIG. 2 shows an example of a direct type backlight in which the light source units 349 are arranged parallel to each other below the LC panel assembly 300. An alternative to the direct type backlight shown in FIG. 2 includes an edge type backlight. In the edge type backlight, the light source units 349 are arranged at one or more edges of the backlight 340, below the LC panel assembly 300 and light emitted by the light source units 349 is distributed to the LC panel assembly 300 by the light guiding plate 342.

Polarizers (not shown) are provided on outer surfaces of the lower and upper panels 100 and 200 for polarizing light emitted by the light source units 349.

Referring to FIG. 1 and FIG. 2, the gray voltage generator 800 is included in the data PCB 550 and generates two sets of gray voltages related to a transmittance of the pixels. The gray voltages of a first set have a positive polarity with respect to the common voltage $v_{com}$, while gray voltages of a second set have a negative polarity with respect to the common voltage $v_{com}$.

An exemplary embodiment of the present invention employs multiple gate drivers 400 and multiple gate TCPs 410. In such an exemplary embodiment, the gate drivers 400 are individually mounted on each gate TCP 410, having shapes of integrated circuit (IC) chips. Additionally, the gate drivers 400 are individually connected to the gate lines $G_1$-$G_n$ of the LC panel assembly 300 for transmitting the gate signals including combinations of a gate-on voltage $V_{on}$ and a gate-off voltage $V_{off}$ input from an external device.

An exemplary embodiment of the present invention employs multiple data drivers 500 and multiple data TCPs 510. In such an exemplary embodiment, the data drivers 500 are individually mounted on each data TCP 510, having shapes of IC chips. Additionally, the data drivers 500 are individually connected to the data lines $D_1$-$D_m$ of the LC panel assembly 300 for transmitting the data voltages which are selected from the gray voltages supplied from the gray voltage generator 800, to the data signal lines $D_1$-$D_m$.

In another embodiment of the present invention, the gate driver 400 or the data driver 500 is directly mounted on the lower panel 100 having the shape of an IC chip. In still another embodiment of the present invention, the gate driver 400 or the data driver 500 is integrated into the lower panel 100 along with other elements. In each of the above cases, the gate or data PCB 450 or 550 or the gate or data TCP 410 or 510 can be omitted.

The signal controller 600 may be included in the data PCB 550 or the gate PCB 450 for controlling an operation of the gate driver 400 or the data driver 500.

Hereinafter, operation of the above-mentioned LCD device will be described in detail.

The signal controller 600 receives input image signals R, G, and B and input control signals for controlling a display of the LCD device. The input control signals include a vertical synchronizing signal $V_{sync}$, a horizontal synchronizing signal $H_{sync}$, a main clock MCLK, a data enable signal DE, etc., all of which are provided from an external graphic controller (not shown). In response to the input image signals R, G, and B and the input control signals, the signal controller 600 processes the input image signals R, G, and B suitably for operation of the LC panel assembly 300 and generates gate control signals CONT1 and data control signals CONT2, and then outputs the gate control signals CONT1 and the data control signals CONT2 to the gate driver 400 and the data driver 500, respectively.

The gate control signals CONT1 include a vertical synchronizing start signal STV for informing the gate driver 400 of a beginning of a frame, a gate clock signal CPV for controlling an output time of the gate-on voltage $V_{on}$, and an output enable signal OE for defining a duration of the gate-on voltage $V_{on}$.

The data control signals CONT2 include a horizontal synchronizing start signal STH for informing the data driver 500 of a beginning of a data transmission, a load signal LOAD for instructing the data driver 500 to apply the data voltages to the data lines $D_1$-$D_m$, a reverse signal RVS for reversing a polarity of the data voltages with respect to the common voltage $V_{com}$, and a data clock signal HCLK.

Responsive to the data control signals CONT2 from the signal controller 600, the data driver 500 successively receives the image data DAT for a row of the pixels from the signal controller 600, shifts them, converts the processed image data DAT into analog data voltages selected from the gray voltages from the gray voltage generator 800, and then applies the data voltages to data lines $D_1$-$D_m$.

The gate driver 400 applies the gate-on voltage Von to the gate lines $G_1$-$G_n$ in response to the gate control signals CONT1 from the signal controller 600, thereby turning on selected switching elements Q. The data voltages applied to the data lines $D_1$-$D_m$ are applied to corresponding pixels through turned-on switching elements Q.

A difference between the data voltage applied to the pixel and the common voltage $V_{com}$ is represented as a voltage across the LC capacitor $C_{LC}$, namely, a pixel voltage. LC molecules in the LC capacitor $C_{LC}$ have orientations that vary in response to a magnitude of the pixel voltage.

The light source driver 920 controls current applied to the light source section 910 for powering the LEDs 344 of the light source section 910. The light source driver 920 also controls a brightness of light emitted by the LEDs 344.

When light emitted by the LEDs 344 passes through the LC layer 3, a polarization of the light is varied according to the orientations of the LC molecules. The polarizer converts a difference of light polarization into a difference of light transmittance.

By repeating the above-mentioned procedure each horizontal period (which is denoted by "1H" and equal to one period of the horizontal synchronizing signal $H_{sync}$, the data enable signal DE, and the gate clock CPV), all gate lines $G_1$-$G_n$ are sequentially supplied with the gate-on voltage $V_{on}$ during a frame, thereby applying the data voltages to all pixels. When a next frame starts after finishing one frame, the reverse control signal RVS applied to the data driver 500 is controlled such that the polarity of the data voltages is reversed with respect to that of a previous frame (which is referred to as "frame inversion"). The reverse control signal RVS may be also controlled such that the polarity of the data voltages flowing in a data line in one frame are reversed (for example, line inversion and dot inversion), or such that the polarity of the data voltages in one packet are reversed (for example, column inversion and dot inversion).

Hereinafter, the light source section 910, including the light source unit 349 for the backlight device according to an exemplary embodiment of the present invention will be described in detail with reference to FIGS. 4, 5, and 6.

Figure 4:
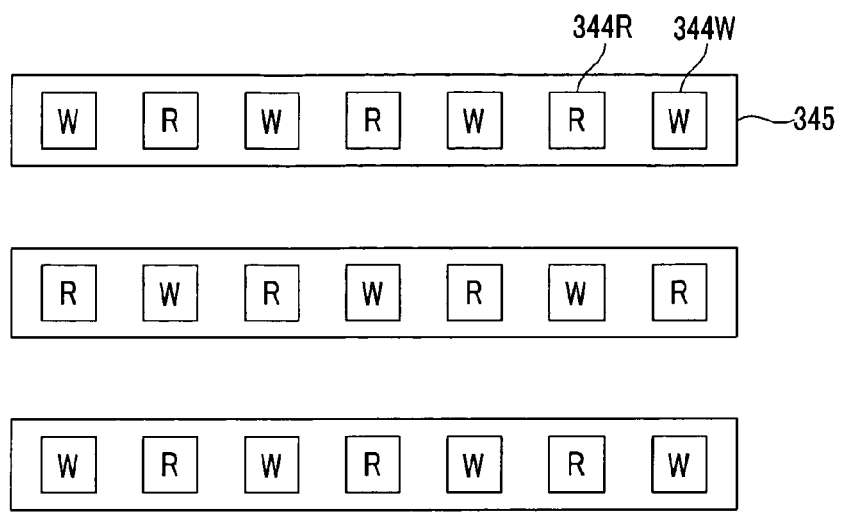
FIG. 4 is a layout view of LEDs for a backlight device according to an exemplary embodiment of the present invention.

FIG. 4 is a layout view of LEDs for a backlight device according to an exemplary embodiment of the present invention. FIG. 5 is a layout view of LEDs for a backlight device according to another exemplary embodiment of the present invention. FIG. 6 is a layout view of LEDs for a backlight device according to yet another exemplary embodiment of the present invention.

Referring to FIG. 4, there are white LEDs 344W and red LEDs 344R mounted alternately in a line on the PCB 345 having a long band-shape. A number of the white LEDs 344W and a number of the red LEDs 344R may be varied depending on a desired brightness of the light emitted from the LEDs 344. Additionally, the number of white and red LEDs 344W and 344R may be varied to control an amount of red light used to compensate for deficiencies in white light emitted from the white LEDs 344W. In this embodiment, the white LEDs 344W and the red LEDs 344R are arranged to produce a uniformly mixed light. For example, if the number of the white LEDs 344W is twice the number of the red LEDs 344R, it is preferable that two white LEDs 344W are provided between each red LED 344R.

It is also preferable that the LEDs 344 disposed at corresponding positions of adjacent PCBs 345 alternate between white LEDs 344W and red LEDs 344R as shown in FIG. 4. Additionally, outputs of the white LEDs 344W and the red LEDs 344R may be controlled according to an amount of red component to be compensated.

Figure 5:
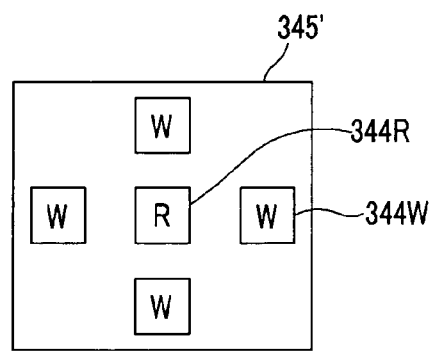
FIG. 5 is a layout view of LEDs for a backlight device according to another exemplary embodiment of the present invention.
Figure 6:
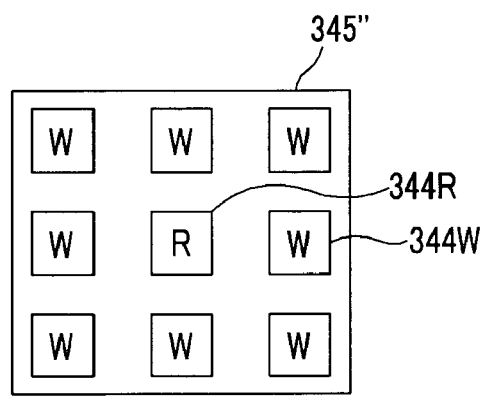
FIG. 6 is a layout view of LEDs for a backlight device according to another exemplary embodiment of the present invention.

FIGS. 5 and 6 show alternative arrays of the white and red LEDs 344W and 344R. Each of FIGS. 5 and 6 shows an LED array unit in which each LED array unit includes a plurality of white LEDs 344W surrounding one red LED 344R. Such LED array units may be configured on one PCB 345' and PCB 345" as shown in FIGS. 5 and 6, or may be configured by linking a plurality of band-shaped PCBs 345 as shown in FIG. 4.

In FIG. 5, the red LED 344R is disposed at a central portion of the PCB 345' and one white LED 344W is disposed proximate to the red LED 344R at each of four adjacent sides. In FIG. 6, the red LED 344R is disposed at a central portion of the PCB 345" and one white LED 344W is disposed proximate to the red LED 344R at each of the four adjacent sides and at each diagonal position. Alternatively, arrangement of the white LEDs 344W and the red LEDs 344R may be further varied.

Figure 7:
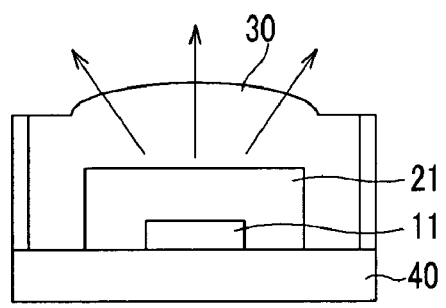
FIG. 7 and FIG. 8 are cross-sectional views of a white LED for a backlight device according to an exemplary embodiment of the present invention.
Figure 8:
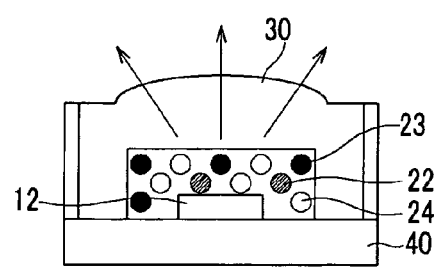

FIG. 7 and FIG. 8 are cross-sectional views of the white LED for the backlight device according to an exemplary embodiment of the present invention.

Referring to FIG. 7, a blue LED chip 11 is mounted on a lead frame 40. A yellow fluorescent material 21 covers the blue LED chip 11 and a molding element 30 covers the yellow fluorescent material 21. The yellow fluorescent material 21 partially converts blue light emitted from the blue LED chip 11 to yellow light. The blue light from the blue LED chip 11 and the yellow light converted by the yellow fluorescent material 21 are mixed to produce white light.

Referring to FIG. 8, an ultraviolet LED chip 12 is mounted on a lead frame 40, and is covered with red fluorescent material 22, green fluorescent material 23, and blue fluorescent material 24. A molding element 30 covers the red, green, and blue fluorescent materials 22, 23, and 24 and the lead frame 40. The red, green, and blue fluorescent materials 22, 23, and 24 convert ultraviolet light emitted by the ultraviolet LED chip 12 to red, green, and blue lights, respectively. In the embodiment shown in FIG. 8, white light is produced when the red, green, and blue lights converted by the red, green, and blue fluorescent materials 22, 23, and 24 are mixed.

A structure of the white LEDs of the present invention may be further varied from those examples shown in FIGS. 7 and 8.

As an alternative to the exemplary embodiments of the present invention using the white LEDs 344W and the red LEDs 344R as the light source, mixed-color-emitting LEDs and/or single-color-emitting LEDs may be used instead of the white LEDs 344W and the red LEDs 344R. For example, an LED mainly emitting blue and green mixed light may be used with the red LED 344R, or an LED mainly emitting red and green-mixed light may be used with a blue LED. Alternatively, an LED mainly emitting red and blue-mixed light may be used with a green LED.

Figure 9:
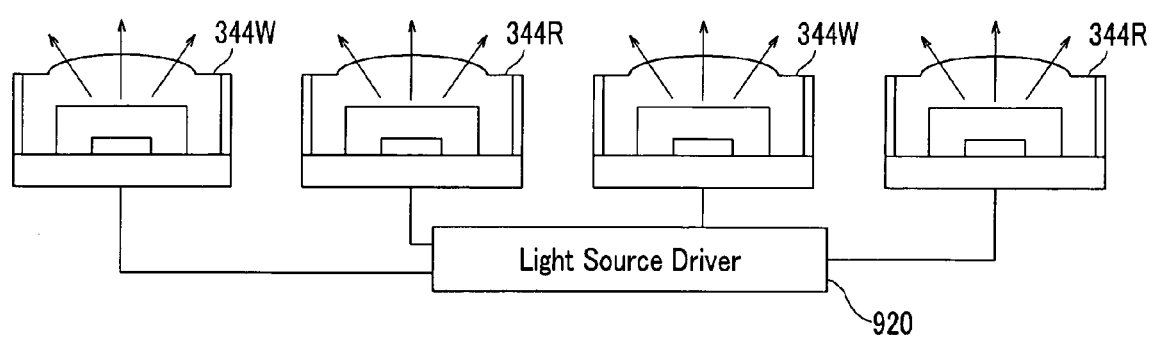
FIG. 9 shows a connection state of a light source driver and LEDs.

FIG. 9 shows a connection state of the light source driver 920 and LEDs 344.

The light source driver 920 is connected to the white LEDs 344W and the red LEDs 344R and supplies electric power to the white and red LEDs 344W and 344R. In a structure as shown in FIG. 9, the brightness of each of the white LEDs 344W and the red LEDs 344R is controlled by the light source driver 920, so that color sensitivity of the white light produced by the backlight device is variable.

Hereinafter, several benefits of the light source for an LCD device according to exemplary embodiments of the present invention will be described.

Figure 10:
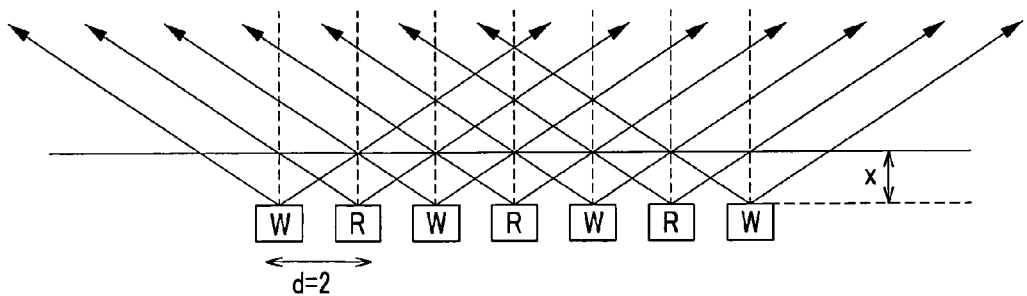
FIG. 10 shows a minimum color mixing area required to produce white light from a backlight device according to an exemplary embodiment of the present invention.
Figure 11:
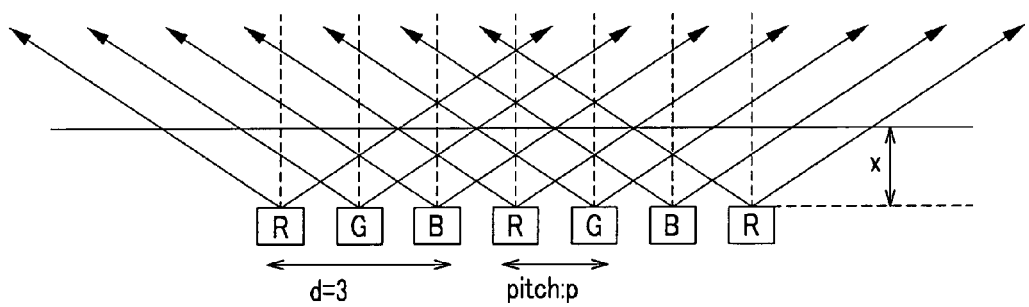
FIG. 11 shows a minimum color mixing area required to produce white light from a backlight device which utilizes a red, green, and blue LED array.
Figure 12:
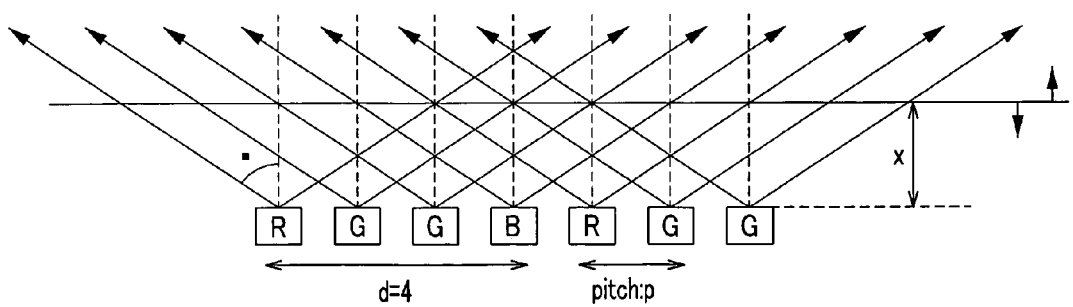
FIG. 12 shows a minimum color mixing area required to produce white light from a backlight device which utilizes a red, green, green, and blue LED array.

FIG. 10 shows a minimum color mixing area required to produce white light from a backlight device according to an exemplary embodiment of the present invention. FIG. 11 shows a minimum color mixing area required to produce white light from a backlight device which utilizes a red, green, and blue LED array. FIG. 12 shows a minimum color mixing area required to produce white light from a backlight device which utilizes a red, green, green, and blue LED array.

In the LED arrays shown in FIGS. 10 to 12, a critical length X of the minimum color mixing area is calculated by the equations below. In the equations below, the minimum color mixing area is defined as a minimum space required for mixing lights emitted from an LED array to produce white light. The critical length X determines a required distance between the LED array and the LCD panel assembly 300 of an LCD device, and therefore directly impacts a thickness of the LCD device. Calculation of the critical length X is performed via equation 1 below.

$$X = 0.5 \times [\text{number of LEDs in a period } (d)] \times [\text{gap between adjacent LEDs } (p)]/\tan a \quad \text{(Equation 1)}$$

In Equation 1, the period is a distance between two LEDs emitting the same light, and a is a half of a light emission angle of an LED. The gap between adjacent LEDs (p) is also called pitch.

Accordingly, in the structure shown in FIG. 10, the critical length X is calculated by equation 2.

$$X = 0.5 \times 2 \times p/\tan a = p/\tan a \quad \text{(Equation 2)}$$

When the red, green, and blue LED array shown in FIG. 10 is used, the critical length X is calculated by equation 3.

$$X = 0.5 \times 3 \times p/\tan a = 1.5 p/\tan a \quad \text{(Equation 3)}$$

When the red, green, green, and blue LED array shown in FIG. 12 is used, the critical length X is calculated by the following equation 4.

$$X = 0.5 \times 4 \times p/\tan a = 2 p/\tan a \quad \text{(Equation 4)}$$

As mentioned above, the minimum color mixing area of the light source according to exemplary embodiments of the present invention is two thirds that of a three color (red, green, and blue) LED array, and is half that of a four color (red, green, green, and blue) LED array.

Thus, if the three or four color LED arrays are used as a light source of an LCD device, a space for a backlight device must be large enough to provide the minimum color mixing area having a critical length X as calculated above. Accordingly, a light source according to the exemplary embodiments of the present invention may be made thinner than the three or four color LED arrays, since the critical length X for the light source according to the exemplary embodiments of the present invention is smaller than the critical length X for the three or four color LED arrays. Thus the light source according to the exemplary embodiments of the present invention is more profitable in facilitating thin LCD devices due to a reduced backlight space requirement.

In addition, according to the exemplary embodiments of the present invention, a color reproducibility of the LCD device is improved. Such a benefit will be described below with reference to FIGS. 13 and 14.

Figure 13:
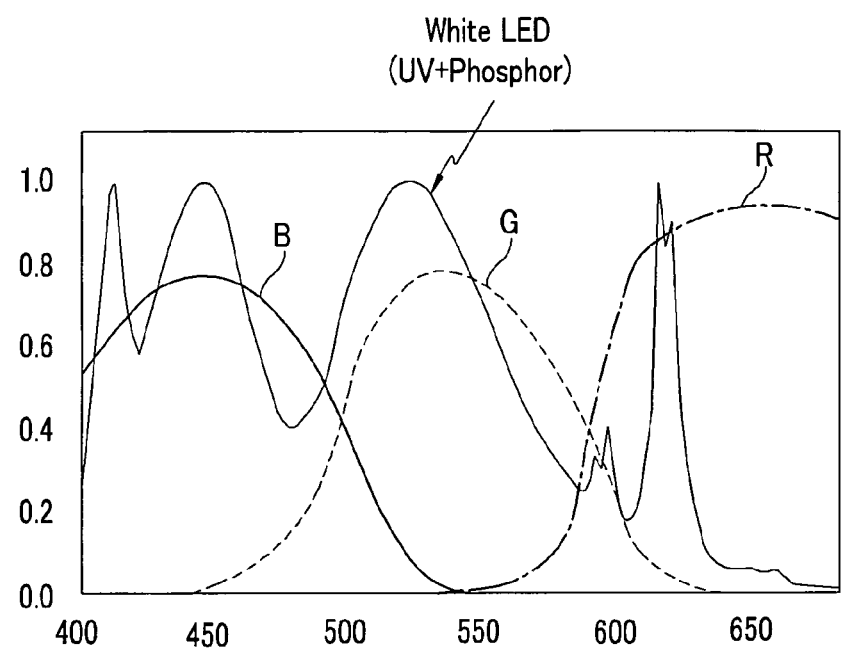
FIG. 13 is a graph for comparison between a spectrum of white light emitted from ultraviolet LEDs and white LEDs using three-color fluorescent materials and spectrums of light passing through red, green, and blue color filters of the LCD device.
Figure 14:
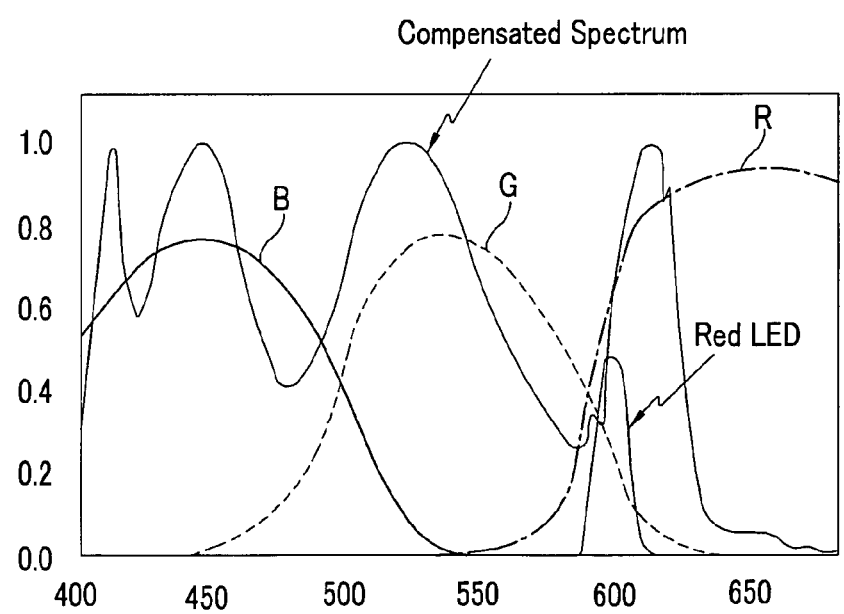
FIG. 14 is a graph for comparison between a spectrum of white light emitted from a light source of a backlight device according to an exemplary embodiment of the present invention and spectrums of light passing through red, green, and blue color filters of the LCD device.

FIG. 13 is a graph for comparison between a spectrum of white light emitted by ultraviolet LEDs and white LEDs using three-color fluorescent materials and spectrums of a complete white light passing through red R, green G, and blue B color filters of the LCD device. A complete white light refers to white light having substantially equal component wavelengths across a visible light spectrum. FIG. 14 is a graph for comparison between a spectrum of white light emitted from a light source of a backlight device according to an exemplary embodiment of the present invention and corresponding spectrums of the complete white light passing through red, green, and blue color filters of the LCD device.

First, referring to FIG. 13, white light emitted from the ultraviolet LEDs and the white LEDs using three-color fluorescent materials does not include light of all wavelength ranges, but partially includes light of blue, green, and red wavelength ranges. In other words, the spectrum of the white light emitted from the white LEDs has two peaks in the range of about 400 nm to about 460 nm corresponding to a blue area, a peak in the range of about 500 nm to about 550 nm corresponding to a green area, and a peak in the range of over about 600 nm corresponding to a red area. By comparing the spectrum of white light emitted from the ultraviolet LEDs and the white LEDs using three-color fluorescent materials and the spectrum of the complete white light passing through red R, green G, and blue B color filters of the LCD device, it is easily seen that in white light emitted from the ultraviolet LEDs and the white LEDs using three-color fluorescent materials, most blue and green wavelengths are included in the spectrum of the white light, but most red wavelengths deviate from the spectrum of the white light. Thus, the white light emitted from the ultraviolet LEDs and the white LEDs using three-color fluorescent materials produces inaccurate red color expression or insufficient red component in the white light.

Referring to FIG. 14, when red light emitted from the red LED is added to white light emitted from the ultraviolet LEDs and the white LEDs using three-color fluorescent materials, it is found that the red area is remarkably compensated. In other words, an addition of the red LED having a peak in the range of about 590 nm to about 610 nm compensates for the insufficient red component in the white light. Accordingly, the LCD device represents more accurate red and color reproducibility of the LCD device is improved.

Figure 15:
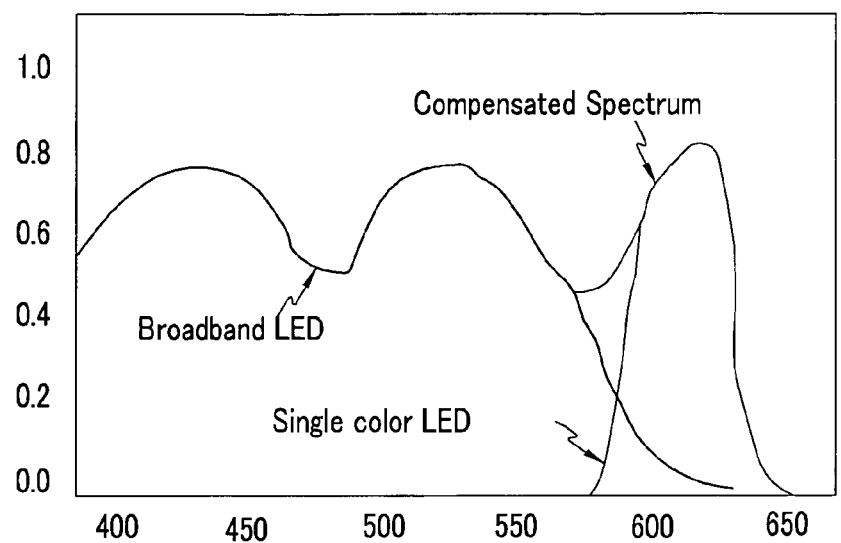
FIG. 15 and FIG. 16 are graphs of spectrums for illustrating a principle for producing more complete white light by using LEDs that emit insufficient white light together with a single-color-emitting LED according to an exemplary embodiment of the present invention.
Figure 16:
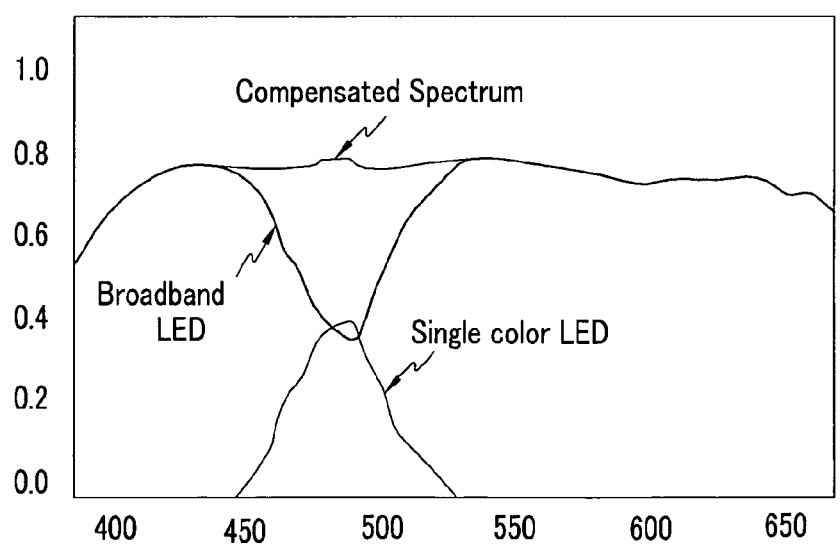

FIGS. 15 and 16 are graphs of spectrums for illustrating a principle for producing a more complete white light by using LEDs that emit insufficient white light together with a single-color-emitting LED as an exemplary embodiment of the present invention.

In the exemplary embodiments of the present invention, the white LEDs 344W lacking a red component and the red LEDs 344R are used together to produce a more complete white light. Similarly, in a case in which a white light source lacking blue or green component, or the mixed-color-emitting LEDs lacking a particular color component wavelength is employed, a single-color-emitting LED capable of compensating for an insufficient component is added, thereby producing the complete white light.

FIG. 15 shows spectrums when mixed-color-emitting LEDs without the red component and a red LED are used together, and FIG. 16 shows spectrums when a white LED lacking a wavelength component of about 450 nm to about 500 nm and the LED having wavelength of about 450 nm to about 500 nm are used together.

Figure 17:
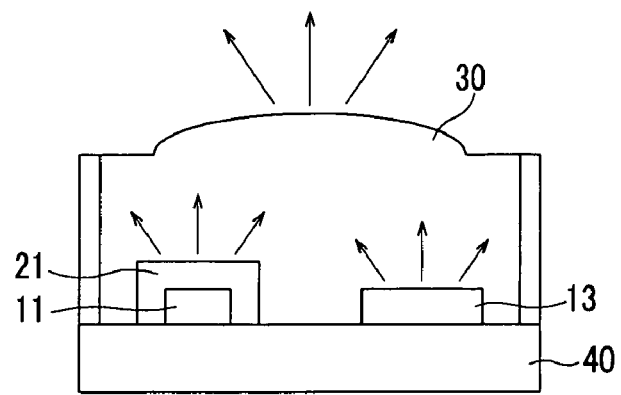
FIG. 17 and FIG. 18 are cross-sectional views of LEDs for a backlight device according to another exemplary embodiment of the present invention.
Figure 18:
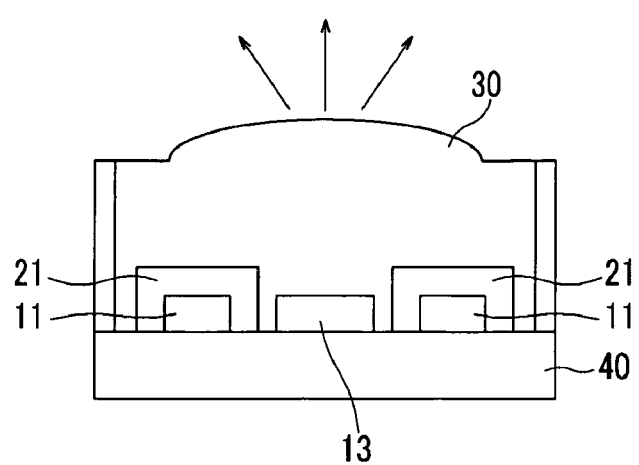

FIGS. 17 and 18 are cross-sectional views of LEDs for a backlight device according to another exemplary embodiment of the present invention.

Referring to FIG. 17, the blue LED chip 11 and a red LED chip 13 are mounted on the lead frame 40. The blue LED chip 11 is covered with the yellow fluorescent material 21 and a molding element 30 covers all of the above-mentioned elements for protection.

A structure shown in FIG. 18 includes two blue LED chips 11 each being covered by corresponding yellow fluorescent materials 21, and the red LED chip 13 disposed between the two blue LED chips 11. In the structure shown in FIG. 18, the red component is reduced as compared with the embodiment of FIG. 17.

It is possible to vary each of a number of the blue and red LED chips 11 and 13, and the yellow fluorescent material 21 in one LED, depending on outputs of the blue and red LED chips 11 and 13 and spectrums required to produce a desired white light.

Integral packaging of a white LED and a red LED as shown in FIGS. 17 and 18 minimizes space required for a light source in the LCD device since a color mixing area is not required, and simplifies LED array processes, improving productivity.

Additionally, when a light source lacking blue or green components, or a mixed-color-emitting LEDs lacking a particular color component in the wavelength is integrally packaged with the single-color-emitting LED capable of compensating an insufficient component, a complete white light source can be obtained.

Such constructed light sources are applicable for direct type backlights and edge type backlights. Edge type backlights will be described with reference to FIGS. 19 to 22.

Figure 19:
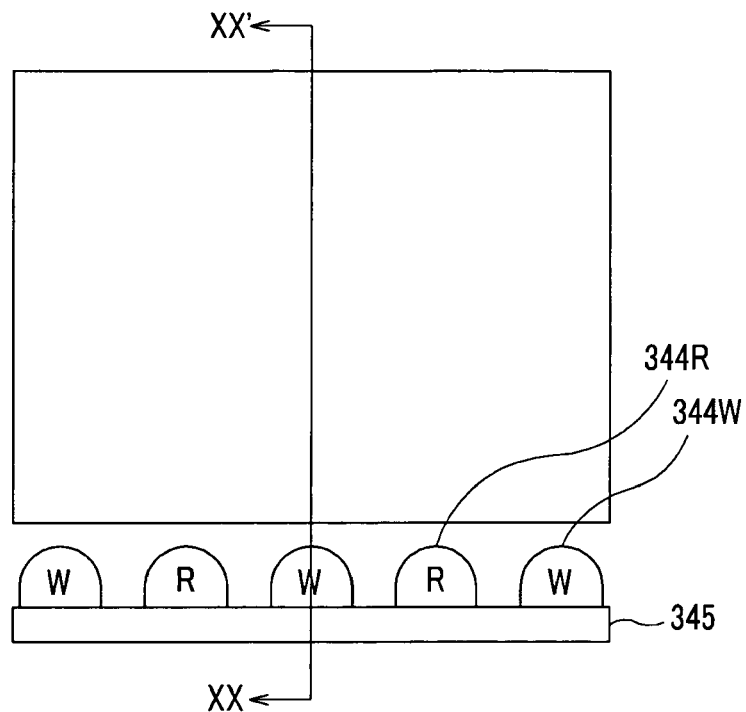
FIG. 19 is a top-side view of an edge type backlight device according to another exemplary embodiment of the present invention.
Figure 20:
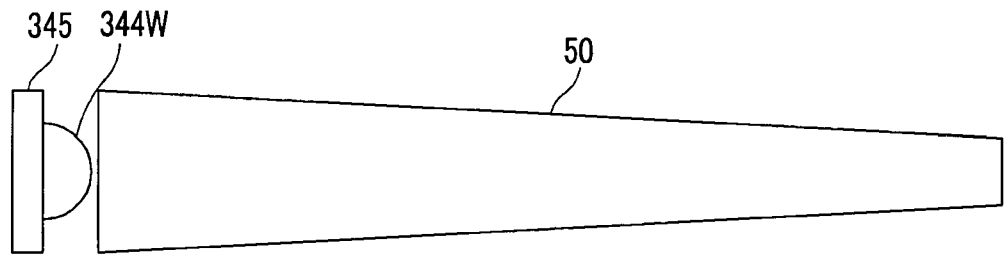
FIG. 20 is a cross-sectional view cut along line XX-XX' of FIG. 19.

FIG. 19 is a top-side view of an edge type backlight device according to another exemplary embodiment of the present invention and FIG. 20 is a cross-sectional view cut along line XX-XX' of FIG. 19.

Referring to FIGS. 19 and 20, a PCB 345 mounting white LEDs 344W and red LEDs 344R thereon is provided at an edge of a wedge-shaped light guiding plate 50.

Figure 21:
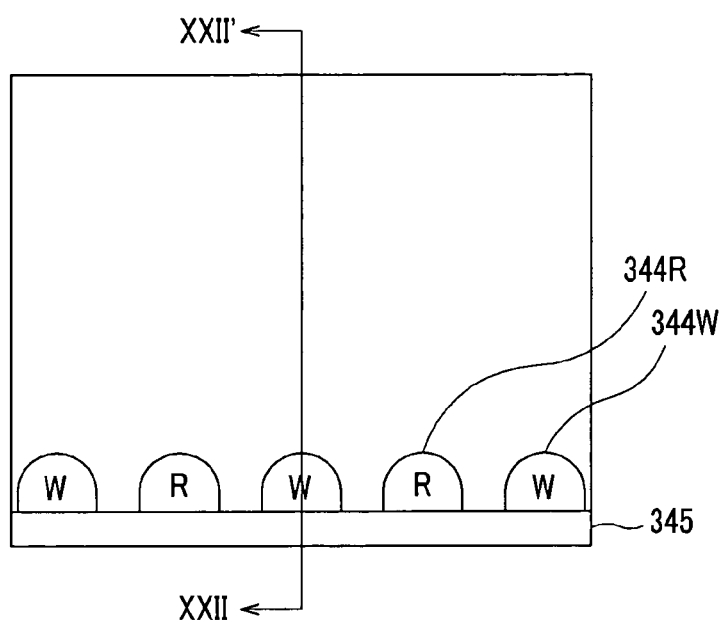
FIG. 21 is a top-side view of an edge type backlight device according to still another exemplary embodiment of the present invention.
Figure 22:
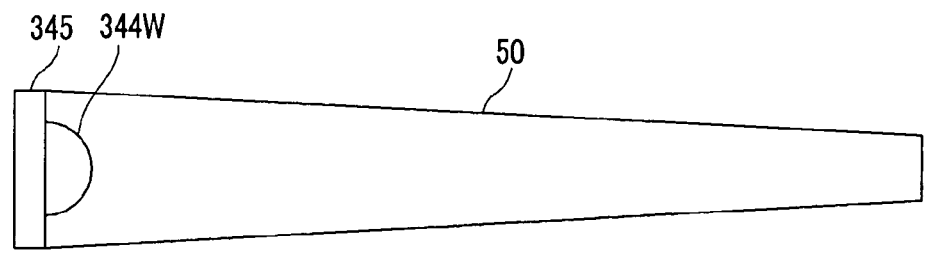
FIG. 22 is a cross-sectional view cut along line XXII-XXII' of FIG. 21.

FIG. 21 is a top-side view of an edge type backlight device according to still another exemplary embodiment of the present invention and FIG. 22 is a cross-sectional view cut along line XXII-XXII' of FIG. 21.

Referring to FIGS. 21 and 22, a PCB 345 mounting white LEDs 344W and red LEDs 344R thereon is provided at an edge of the wedge-shaped light guiding plate 50. The wedge-shaped light guiding plate 50 includes grooves for receiving the white LEDs 344W and red LEDs 344R therein. Such a structure reduces an amount of space required for a backlight in the LCD device, as compared to the structure shown in FIGS. 19 and 20, and prevents light emitted from the white and red LEDs 344W and 344R from deviating from the light guiding plate 50.

Figure 23:
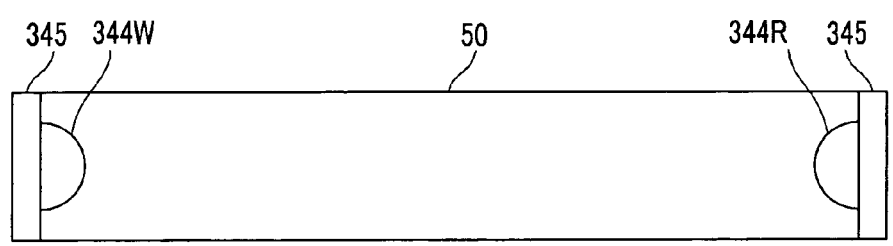
FIG. 23 is a cross-sectional view of an edge type backlight device according to still another exemplary embodiment of the present invention.

FIG. 23 is a cross-sectional view of an edge type backlight device according to still another exemplary embodiment of the present invention.

As shown in FIG. 23, two PCBs 345 mounting white LEDs 344W and red LEDs 344R thereon are individually provided at each opposite edge of a light guiding plate 50'. In this embodiment, a flat panel-shaped light guiding plate 50' is used.

Meanwhile, instead of the white LEDs 344W and red LEDs 344R used in the embodiments shown in FIG. 13 to FIG. 19, the white light source lacking blue or green component, or the mixed-color-emitting LEDs lacking a particular color component in the wavelength can be used together with the single-color-emitting LED capable of compensating the insufficient component.

According to the present invention, the space required for a light source using LEDs is reduced in the LCD device, and white light of acceptable quality can be produced.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. A light source for a display device comprising:
   a board; and
   light emitting diodes (LEDs) mounted on the board,
   wherein the LEDs include a white LED which emits white light and a red LED which emits red light, and
   the white LED includes an ultraviolet LED chip and a mixture of red fluorescent material, green fluorescent material, and blue fluorescent material covering the ultraviolet LED chip.

2. The light source of claim 1, wherein the LED chip is disposed at a lead frame and the fluorescent material is covered by a molding element.

3. The light source of claim 1, further comprising white LEDs and red LEDs arranged alternately in a line on the board.

4. The light source of claim 1, further comprising white LEDs arranged on the board to surround the red LED.

5. A light source for a display device comprising:
   a board;
   a first LED mounted on the board, the first LED including an LED chip emitting ultraviolet light and a fluorescent material of a mixture of red fluorescent material, green fluorescent material, and blue fluorescent material for converting a wavelength of light emitted from the LED chip; and
   a second LED mounted on the board, the second LED including no fluorescent material.

6. The light source of claim 5, further comprising first LEDs and second LEDs arranged alternately in a line on the board.

7. The light source of claim 5, further comprising first LEDs arranged to surround the second LED.

8. The light source of claim 5, wherein the second LED emits one of red light, green light, and blue light.

9. The light source of claim 8, wherein the second LED emits red light.

10. A light source for a display device comprising:
    a board;
    a first LED mounted on the board and emitting light having a spectrum width which spans a wavelength range below about 600 nm; and
    a second LED mounted on the board and emitting light having a spectrum width which spans a wavelength range above about 600 nm,
    wherein the first LED includes an ultraviolet LED chip and a mixture of red fluorescent material, green fluorescent material, and blue fluorescent material covering the ultraviolet LED chip.

11. The light source of claim 10, wherein a spectrum of light emitted by the first LED has at least two peaks, and a spectrum of light emitted by the second LED has a peak.

12. The light source of claim 11, wherein the spectrum of the light emitted by the first LED has a peak in a red area, a peak in a green area, and a peak in a blue area.

13. The light source of claim 11, wherein the spectrum of the light emitted from the second LED has the peak in a red area.

14. A light emitting diode (LED) comprising:
a lead frame;
a first LED chip mounted on the lead frame and emitting ultraviolet light;
a fluorescent material of a mixture of red fluorescent material, green fluorescent material, and blue fluorescent material coverings the first LED chip;
a second LED chip mounted on the lead frame; and
a molding element which covers all of the first LED chip, the fluorescent material and the second LED chip.

15. The light emitting diode of claim 14, wherein a number of first LED chips is larger than a number of second LED chips.

16. The light emitting diode of claim 14, wherein the first LED chip emits blue light, and the second LED chip emits red light.

17. The light emitting diode of claim 14, wherein the second LED chip emits one of red light, green light, and blue light.

18. A backlight device comprising:
a light guiding plate; and
a first light source disposed at a first edge of the light guiding plate and including a white LED emitting white light and a red LED emitting red light,
wherein the light guiding plate has a largest thickness at the first edge, and becomes gradually slimmer while extending toward a second edge that is opposite to the first edge.

19. The backlight device of claim 18, wherein the light guiding plate includes grooves and the white LED and the red LED are disposed in the grooves.

20. The backlight device of claim 18, further comprising a second light source disposed at a second edge of the light guiding plate that is opposite to the first edge of the light guiding plate.

21. The backlight device of claim 18, wherein the white LED includes a blue LED chip and a yellow fluorescent material covering the blue LED chip.

22. A backlight device comprising:
a board;
a white LED mounted on the board and emitting white light;
a red LED mounted on the board and emitting red light; and
a reflecting plate mounted on the board and including holes for exposing portions of the white LED and the red LED,
wherein the white LED includes an ultraviolet LED chip and a mixture of red fluorescent material, green fluorescent material, and blue fluorescent material covering the ultraviolet LED chip.

23. The backlight device of claim 22, wherein the white LED and the red LED are arranged in a line on the board.

24. The backlight device of claim 23, further comprising a plurality of boards arranged substantially parallel to each other.

25. A light source for a display device comprising:
a board:
a first LED mounted on the board and emitting light having a spectrum width which spans a first wavelength range; and
a second LED mounted on the board and emitting light having a spectrum width which spans a second wavelength range,
wherein the first LED includes an ultraviolet LED chip and a mixture of red fluorescent material, green fluorescent material, and blue fluorescent material covering the ultraviolet LED chip, and
the first and second wavelength ranges are substantially mutually exclusive and the first and second wavelength ranges combine to substantially span an entire wavelength range of visible light.

* * * * *